(12) United States Patent  
Nakata et al.

(10) Patent No.: US 8,742,426 B2  
(45) Date of Patent: Jun. 3, 2014

(54) SEMICONDUCTOR DEVICE

(75) Inventors: Ken Nakata, Kanagawa (JP); Isao Makabe, Kanagawa (JP); Keiichi Yui, Kanagawa (JP)

(73) Assignee: Sumitomo Electric Industries, Ltd., Osaka (JP)

(*) Notice: Subject to any disclaimer, the term of this patent is extended or adjusted under 35 U.S.C. 154(b) by 102 days.

(21) Appl. No.: 13/192,247

(22) Filed: Jul. 27, 2011

(65) Prior Publication Data  
US 2012/0025205 A1 Feb. 2, 2012

(30) Foreign Application Priority Data  
Jul. 28, 2010 (JP) .................. 2010-169830

(51) Int. Cl.  
*H01L 29/15* (2006.01)

(52) U.S. Cl.  
USPC .................. 257/77; 257/E21.054

(58) Field of Classification Search  
USPC .............................. 257/77, E21.054  
See application file for complete search history.

(56) References Cited

U.S. PATENT DOCUMENTS

| 5,670,798 | A  | * | 9/1997  | Schetzina | 257/96  |
|-----------|----|---|---------|-----------|---------|
| 6,559,467 | B2 | * | 5/2003  | Nikolaev et al. | 257/12 |
| 2005/0280070 | A1 | * | 12/2005 | Ohsawa | 257/314 |
| 2008/0210949 | A1 |  | 9/2008 | Makabe et al. | |
| 2010/0109018 | A1 | * | 5/2010 | Chen et al. | 257/76 |

FOREIGN PATENT DOCUMENTS

JP 2008-166349 A 7/2008

\* cited by examiner

*Primary Examiner* — Dale E Page  
(74) *Attorney, Agent, or Firm* — Westerman, Hattori, Daniels & Adrian, LLP

(57) ABSTRACT

A semiconductor device includes an AlGaN layer that is provided on a SiC substrate and has an acceptor concentration equal to or higher than a donor concentration, a GaN layer provided on the AlGaN layer, and an electron supply layer that is provided on the GaN layer and has a band gap greater than that of GaN.

5 Claims, 8 Drawing Sheets

SEMICONDUCTOR DEVICE

CROSS-REFERENCE TO RELATED APPLICATION

This application is based upon and claims the benefit of priority of the prior Japanese Patent Application No. 2010-169830 filed on Jul. 28, 2010, the entire contents of which are incorporated herein by reference.

BACKGROUND (i) Technical Field

A certain aspect of the embodiments discussed herein is related to a semiconductor device. Another aspect of the embodiments is related to a semiconductor device having a SiC substrate.

(ii) Related Art

A semiconductor devices using a nitride semiconductor is used as a power device operating at high frequencies and outputting high power. Particularly, there is known an FET such as a high electron mobility transistor (HEMT) as a semiconductor device suitable for amplification in a high-frequency or RF (radio Frequency) band such as a microwave band, a quasi-millimeter band or a millimeter band.

As a semiconductor device having a nitride semiconductor, there is known a semiconductor device in which an AlN layer, an AlGaN layer, a GaN layer and an electron supply layer are sequentially stacked in this order on a Si substrate (see Japanese Patent application Publication No. 2008-166349). As a substrate for the semiconductor device including a nitride semiconductor, there is known a SiC substrate having a lattice constant relatively close to that of GaN besides the Si substrate.

The semiconductor device using a nitride semiconductor is desired to operate at higher frequencies. Higher operating frequencies may be achieved by improving the pinch-off characteristic.

SUMMARY

According to an aspect of the present invention, there is provided a semiconductor device including: an AlGaN layer that is provided on a SiC substrate and has an acceptor concentration equal to or higher than a donor concentration; a GaN layer provided on the AlGaN layer; and an electron supply layer that is provided on the GaN layer and has a band gap greater than that of GaN.

DETAILED DESCRIPTION

Figure 1:
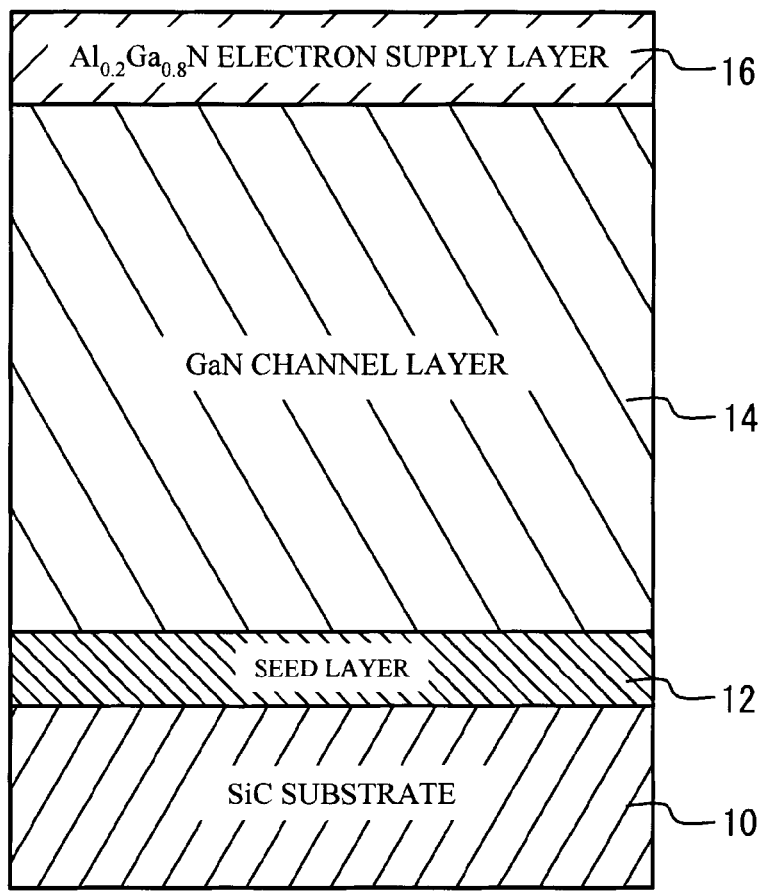
FIG. 1 is a schematic cross-sectional view of an epitaxial layer of a semiconductor device in accordance with a first comparative example.

First, semiconductor devices in accordance with first and second comparative examples are described. FIG. 1 is a schematic cross-sectional view of an epitaxial layer of a semiconductor device in accordance with the first comparative example. As illustrated in FIG. 1, a seed layer 12 made of aluminum nitride (AlN) is grown on a SiC substrate 10 by metal organic chemical vapor deposition (MOCVD), for example. The growth condition is as follows.

Source gas: TMA (trimethylaluminium), $NH_3$ (ammonia)
    Growth temperature: 1100° C.
    Pressure: 13.3 kPa
    Thickness: 25 nm A GaN channel layer 14 is grown on the seed layer 12 under the following condition.

Source gas: TMG (trimethylgallium), $NH_3$
    Growth temperature: 1100° C.
    Pressure: 13.3 kPa
    V/III ratio: 5000
    Growth rate: 0.2 nm/sec
    Thickness: 1500 nm An AlGaN electron supply layer 16 is grown on the GaN channel layer 14 under the following condition.

Source gas: TMA, TMG, $NH_3$
    Al composition ratio: 20%
    Thickness: 25 nm

Figure 2:
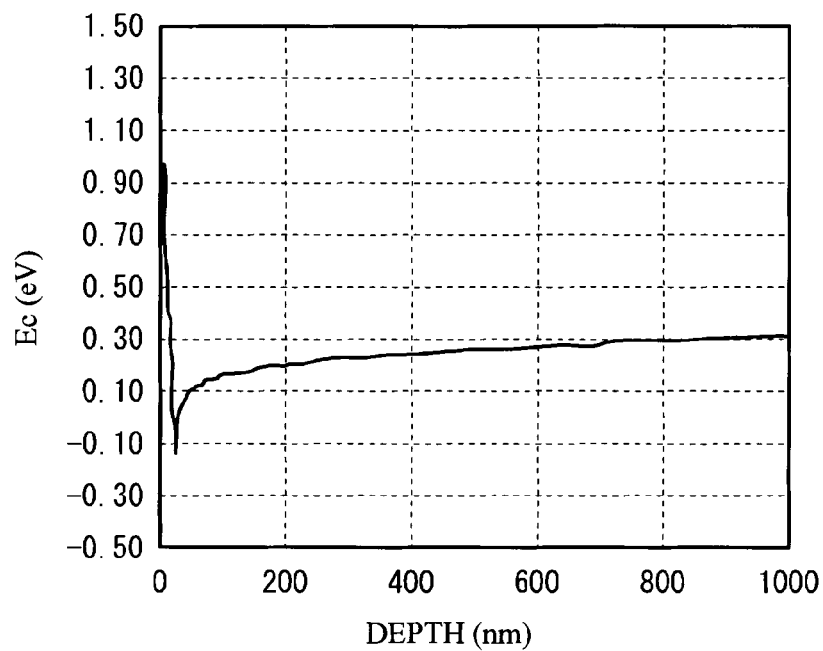
FIG. 2 is a band diagram obtained by simulating a change of Ec associated with the depth from the upper surface of an AlGaN electron supply layer.

FIG. 2 is a band diagram obtained by simulating a change of Ec (the bottom of the energy level of the conduction band) associated with the depth from the upper surface of the AlGaN electron supply layer 16 illustrated in FIG. 1. As illustrated in FIG. 2, Ec of the GaN channel layer 14 is low. This may result from the following. That is, SiC and GaN do not have a great difference in the band gap. Thus, even when the GaN channel layer 14 is grown on the SiC substrate 10, the band in the vicinity of the interface between the SiC substrate 10 and the GaN channel layer 14 does not rise. Due to the low Ec, the pinch-off characteristic may not be good.

Figure 3:
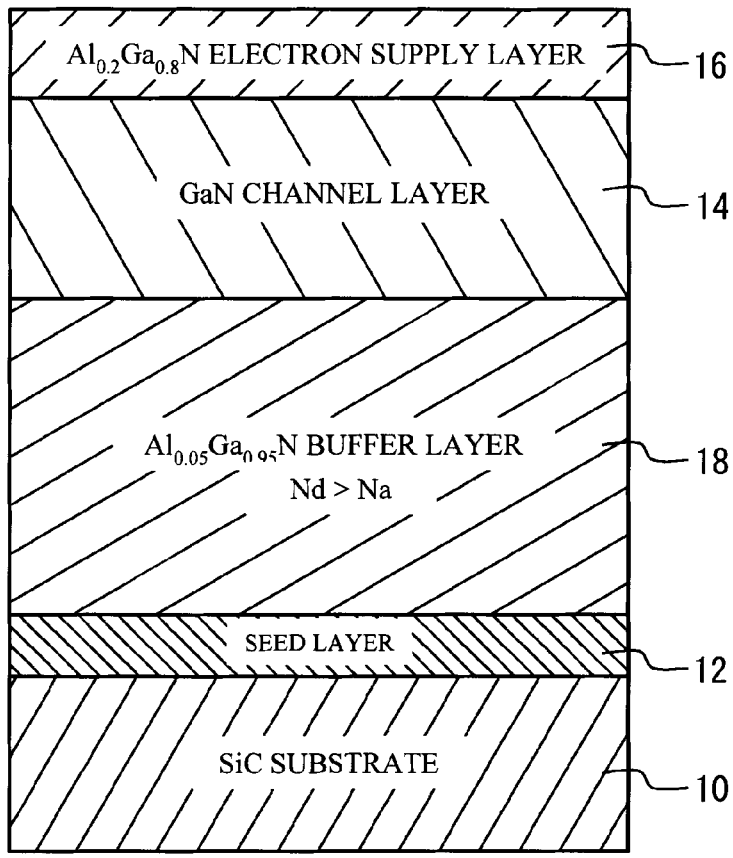
FIG. 3 is a schematic cross-sectional view of an epitaxial layer of a semiconductor device in accordance with a second comparative example.

FIG. 3 is a schematic cross-sectional view of an epitaxial layer of a semiconductor device in accordance with the second comparative example. Referring to FIG. 3, the seed layer 12 made of AlN is grown on the SiC substrate 10 by MOCVD under the following condition.

Source gas: TMA, $NH_3$ (ammonia)
    Growth temperature: 1100° C.
    Pressure: 13.3 kPa Thickness: 25 nm An AlGaN buffer layer 18 is grown on the seed layer 12 under the following condition.
Source gas: TMA, TMG, NH$_3$
Growth temperature: 1100° C.
Pressure: 13.3 kPa
V/III ratio: 5000
Growth rate: 0.2 nm/sec
Al composition ratio: 5%
Thickness: 1000 nm The GaN channel layer 14 is grown on the AlGaN buffer layer 18 under the following condition.
Source gas: TMG, NH$_3$
Growth temperature: 1100° C.
Pressure: 13.3 kPa
V/III ratio: 5000
Growth rate: 0.2 nm/sec
Thickness: 500 nm The AlGaN electron supply layer 16 is grown on the GaN channel layer 14 under the following condition.
Source gas: TMA, TMG, NH$_3$
Al composition ratio: 20%
Thickness: 25 nm Ec of AlGaN, which is a mixed crystal of GaN and AlN, changes in accordance with the mixed crystal ratio. The second comparative example is configured to provide the AlGaN buffer layer 18 on the seed layer 12. It is thus expected that the Ec of the second comparative example is higher than that of the first comparative example and the pinch-off characteristic is improved.

Figure 4:
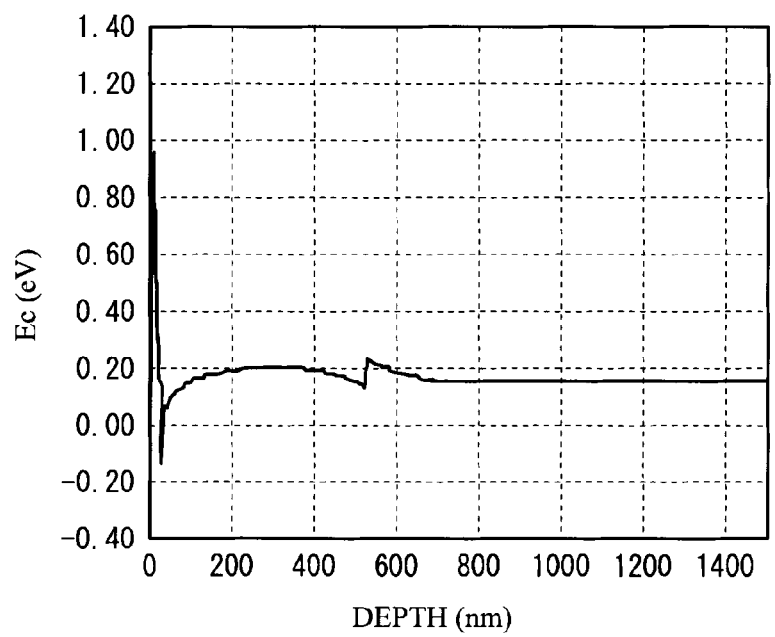
FIG. 4 is a band diagram obtained by simulating a change of Ec associated with the depth from the upper surface of an AlGaN electron supply layer illustrated in FIG. 3.

FIG. 4 is a band diagram obtained by simulating a change of Ec associated with the depth from the upper surface of the AlGaN electron supply layer 16 illustrated in FIG. 3. In the simulation of the second comparative example, the acceptor concentration (Na) of the AlGaN buffer layer 18 is $1.0 \times 10^{16}$/cm$^3$, and the donor concentration (Nd) thereof is $2.0 \times 10^{16}$/cm$^3$. As illustrated in FIG. 4, Ec of the AlGaN buffer layer 18 does not have an expected rise. The AlGaN buffer layer 18 is grown by the MOCVD process using the sources of TMA, TMG and NH$_3$. When the growth temperature becomes as high as 1100° C., impurities of C (carbon), O (oxygen) and Si (silicon) included in TMA, TMG and NH$_3$ are introduced to the AlGaN buffer layer 18. Generally, the TMA source has a purity lower than that of the TMG source. Therefore, a lot of O and Si is included in AlGaN, as compared with GaN. C functions as an acceptor, and O and Si function as donors. Thus, in the AlGaN buffer layer 18, the donor concentration (Nd) is higher than the acceptor concentration (Na). Thus, the AlGaN buffer layer 18 has an n-type conductivity, and the expected rise of Ec may not be realized.

According to an aspect of embodiments described below, Ec is raised to improve the pinch-off characteristic.

First Embodiment

Figure 5:
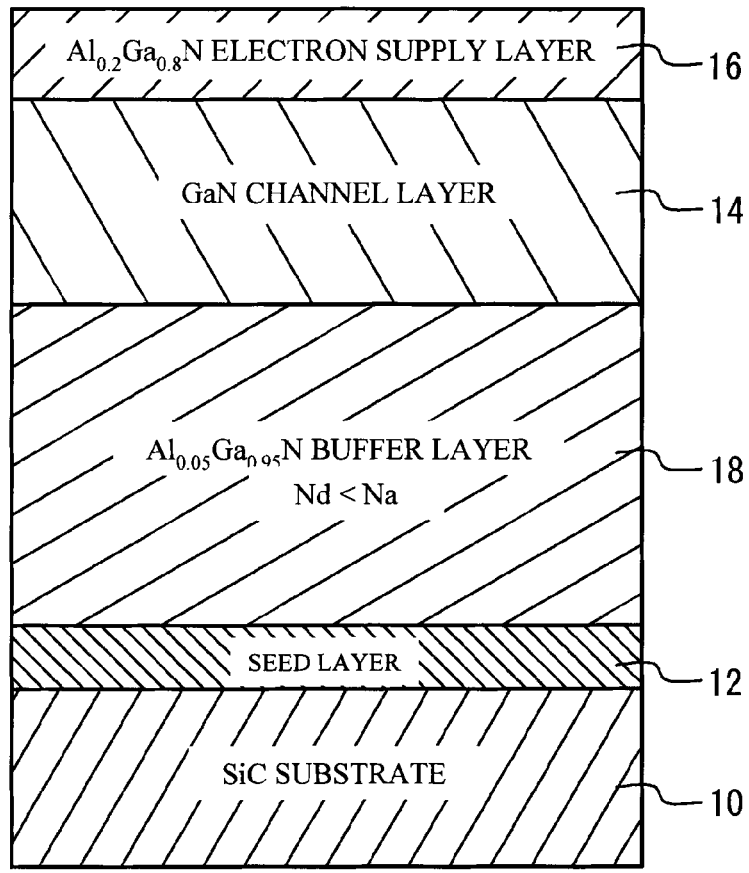
FIG. 5 is a schematic cross-sectional view of a semiconductor device in accordance with a first embodiment.
Figure 6:
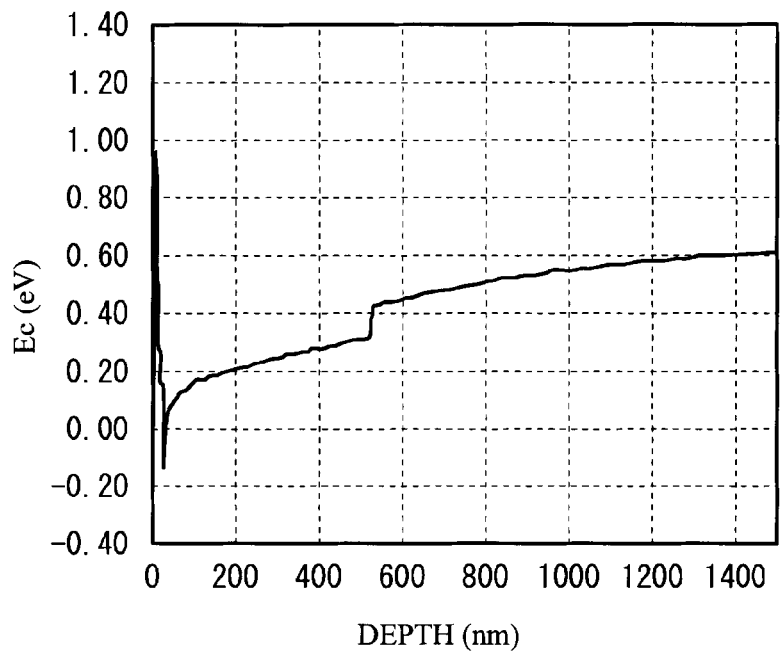
FIG. 6 is a band diagram obtained by simulating a change of Ec associated with the depth from the upper surface of an AlGaN electron supply layer illustrated in FIG. 5.

FIG. 5 is a schematic cross-sectional view of a semiconductor device in accordance with a first embodiment. Referring to FIG. 5, the surface of the SiC substrate 10 after acid cleaning is cleaned in an H$_2$ atmosphere at a temperature higher than the growth temperature. Next, the seed layer 12 made of AlN is grown on the SiC substrate 10 by MOCVD under the following condition.
Source gas: TMA, NH$_3$
Growth temperature: 1100° C.
Pressure: 13.3 kPa
Thickness: 25 nm The AlGaN buffer layer 18 is grown on the seed layer 12 under the following condition.
Source gas: TMA, TMG, NH$_3$
Growth temperature: 1050° C.
Pressure: 13.3 kPa
V/III ratio: 1000
Growth rate: 0.3 nm/sec
Al composition ratio: 5%
Thickness: 1000 nm The GaN channel layer 14 is grown on the AlGaN buffer layer 18 under the following condition.
Source gas: TMG, NH$_3$
Growth temperature: 1100° C.
Pressure: 13.3 kPa
V/III ratio: 5000
Growth rate: 0.2 nm/sec
Thickness: 500 nm The AlGaN electron supply layer 16 is grown on the GaN channel layer 14 under the following condition.
Source gas: TMA, TMG, NH$_3$
Al composition ratio: 20%
Thickness: 25 nm FIG. 6 is a band diagram obtained by simulating a change of Ec associated with the depth from the upper surface of the AlGaN electron supply layer 16 illustrated in FIG. 5. In the first embodiment, the acceptor concentration (Na) of the AlGaN buffer layer 18 is $4.0 \times 10^{16}$/cm$^3$, and the donor concentration (Nd) thereof is $2.0 \times 10^{16}$/cm$^3$. As illustrated in FIG. 6, Ec of the AlGaN buffer layer 18 is higher than that of the second comparative example. The reason why Ec of the AlGaN buffer layer 18 of the first embodiment is higher may be considered as follows. The growth condition for the AlGaN buffer layer 18 in the first embodiment differs from that in the second comparative example in that the growth temperature is reduced, and the V/III ratio is reduced, while the growth rate is increased. It is thus possible to include more C included in TMA, TMG and NH$_3$ in the AlGaN buffer layer 18. Thus, the C concentration is higher than the sum of the O concentration and the Si concentration. The acceptor concentration (Na) of the AlGaN buffer layer 18 becomes higher than the donor concentration (Nd). Thus, the first embodiment does not have the n-type conductivity unlike the second comparative example, and realizes higher Ec.

Figure 7:
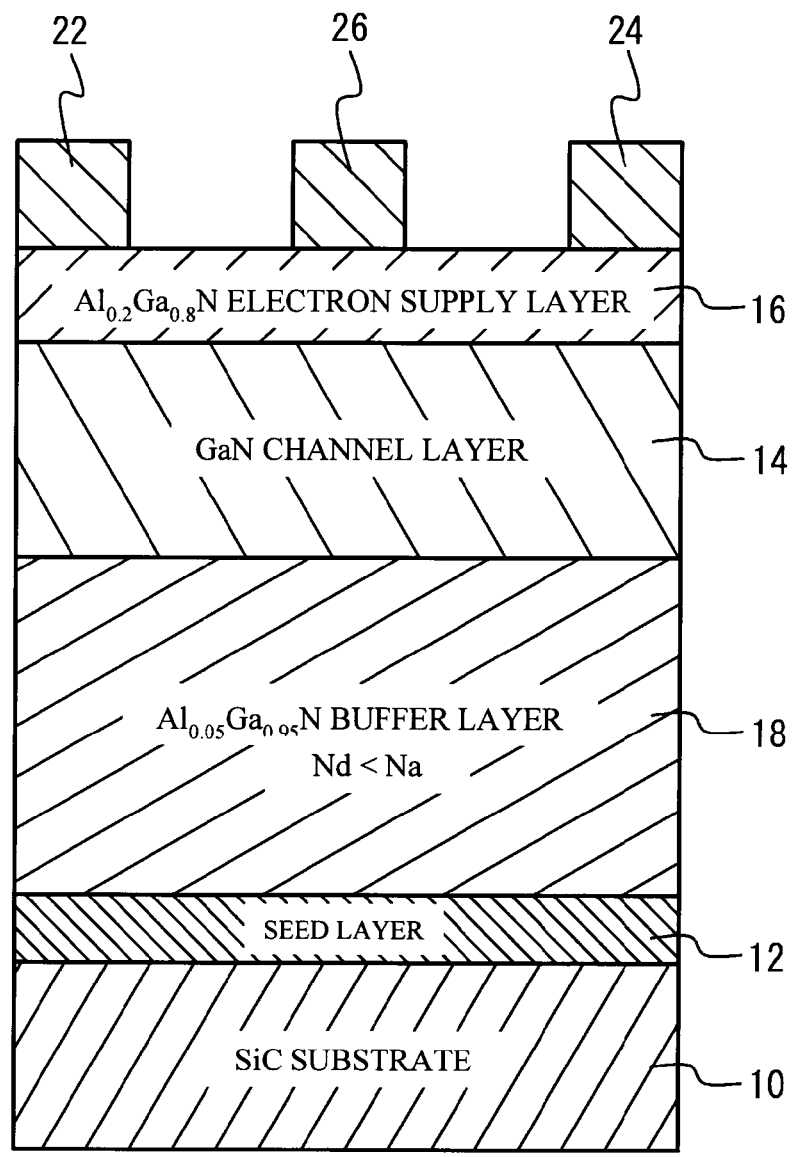
FIG. 7 is a schematic cross-sectional view of a semiconductor device in accordance with a first embodiment.

FIG. 7 is a schematic cross-sectional view of a semiconductor device in accordance with the first embodiment. Referring to FIG. 7, the semiconductor device of the first embodiment has an epitaxial layer as illustrated in FIG. 5, and a source electrode 22 and a drain electrode 24 on the AlGaN electron supply layer 16. The source electrode 22 and the drain electrode 24 are ohmic electrodes, and may have a two-layer structure of Ti (titanium) and Al (aluminum) stacked in this order on the AlGaN electron supply layer 16. A gate electrode 26 is provided on the AlGaN electron supply layer 16 and is interposed between the source electrode 22 and the drain electrode 24. The gate electrode 26 may have a two-layer structure of Ni (nickel) and Au (gold) stacked in this order on the AlGaN electron supply layer 16.

A description is now given of a simulation of a current-voltage characteristic of the semiconductor substrate of the first embodiment in the off state. A similar simulation was carried out for the semiconductor devices of the first and second comparative examples. The semiconductor device of the first comparative example has the epitaxial layer illustrated in FIG. 1, and has the source, drain and gate electrodes on the AlGaN electron supply layer 16. The semiconductor device of the second comparative example has the epitaxial layer illustrated in FIG. 3, and has the source, drain and gate electrodes on the AlGaN electron supply layer 16.

In the first comparative example, the drain current is $3.3 \times 10^{-4}$ A/mm for a gate voltage of −3 V. In the second comparative example, the drain current is $4.5×10^{-3}$ A/mm for a gate voltage of −3 V. In the first embodiment, the drain current is $8.9×10^{-6}$ A/mm for a gate voltage of −3 V. As described above, the semiconductor device of the first embodiment is capable of improving the pinch-off characteristic.

Figure 8:
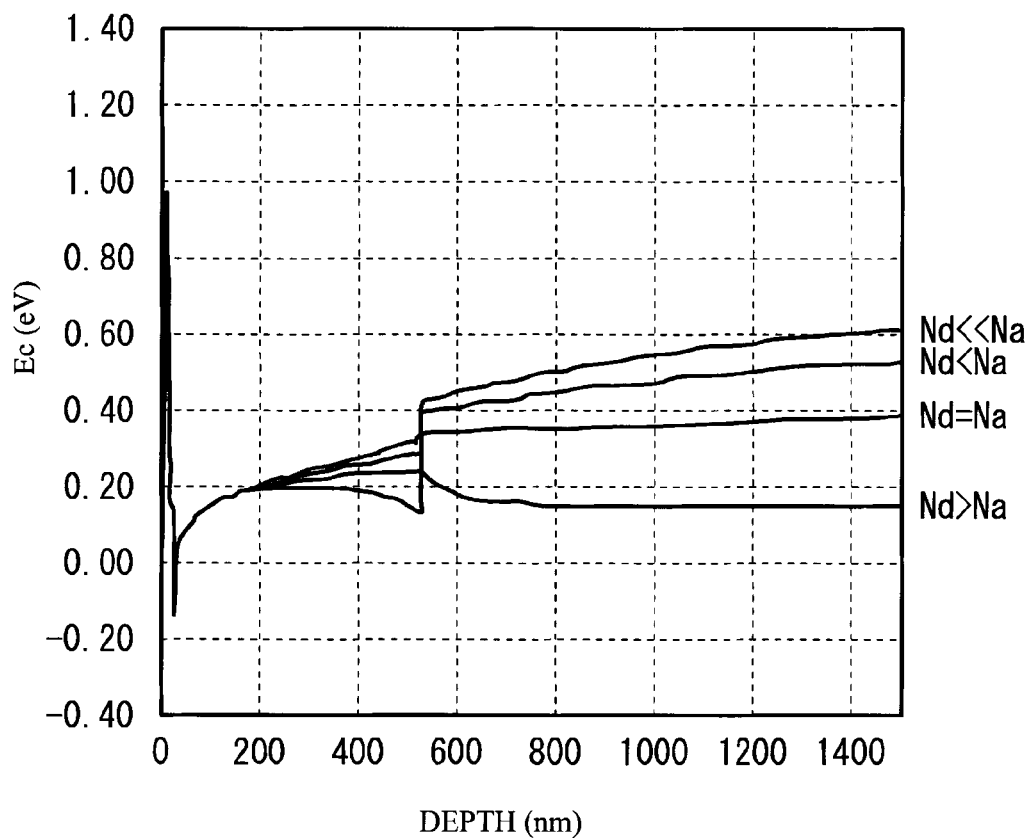
FIG. 8 is a band diagram obtained by simulating a correlation between a concentration balance between Na and Nd in an AlGaN buffer layer and Ec.

FIG. 8 is a band diagram obtained by simulating a correlation between Ec of the AlGaN buffer layer 18 and a concentration balance between the acceptor concentration (Na) and the donor concentration (Nd) in the AlGaN buffer layer 18 in the structure illustrated in FIG. 5. As illustrated in FIG. 8, in a case where the acceptor concentration (Na) is $1.0×10^{16}/cm^3$ and the donor concentration (Nd) is $2.0×10^{16}/cm^3$ (in a case where Nd>Na), Ec does not rise. In contrast, Ec rises in a case where both Na and Nd are $2.0×10^{16}/cm^3$ (Na=Nd), a case where Na=$3.0×10^{16}/cm^3$ and Nd=$2.0×10^{16}/cm^3$ (Na>Nd) and a case where Na=$4.0×10^{16}/cm^3$ and Nd=$2.0×10^{16}/cm^3$ (Na>>Nd). As described above, in the case where Na is equal to or greater than Nd (Na≥Nd), Ec can be raised. In the case where Na is greater than Nd (Na>Nd), Ec can be raised more considerably. That is, in the case where Na is equal to or greater than Nd, the pinch-off characteristic can be improved. In the case where Na is greater than Nd, the pinch-off characteristic can be improved more considerably.

A description is now given of a simulation of an off-state current-voltage characteristic of a semiconductor device according to a first variation of the first embodiment in which the acceptor concentration (Na) of the AlGaN buffer layer 18 and the donor concentration (Nd) thereof are equal to each other. The first variation is the same as illustrated in FIG. 7 except that both the acceptor concentration (Na) of the AlGaN buffer layer 18 and the donor concentration (Nd) thereof are equal to $2.0×10^{16}/cm^3$. In the semiconductor device of the first variation, the drain current is $1.7×10^{-5}$ A/mm for a gate voltage of −3 V. Even when the acceptor concentration (Na) of the AlGaN buffer layer 18 and the donor concentration (Nd) thereof are equal to each other, the pitch-off characteristic is really improved.

As described above, the first embodiment sets the acceptor concentration (Na) of the AlGaN buffer layer 18 equal to or higher than the donor concentration (Nd) of the AlGaN buffer layer 18 in the epitaxial structure in which the seed layer 12, the AlGaN buffer layer 18, the GaN channel layer 14 and the AlGaN electron supply layer 16 sequentially stacked on the SiC substrate 10. It is thus possible to raise Ec and improve the pinch-off characteristic.

In the case where the AlGaN buffer layer 18 is grown by the MOCVD process using the sources of TMA, TMG and NH3, impurities of C, O and Si are included in the AlGaN buffer layer 18. C functions as an acceptor impurity, and O and Si function as donor impurities. It is thus preferable that the C concentration is equal to or higher than the sum of the O concentration and the Si concentration. By setting the acceptor concentration (Na) of the AlGaN buffer layer 18 equal to or higher than the donor concentration (Nd) thereof, it is possible to raise Ec and improve the pinch-off characteristic.

The first embodiment is not limited to the case where the acceptor concentration (Na) of the AlGaN buffer layer 18 is 4.0×1016/cm3, and the donor concentration (Nd) thereof is 2.0×1016/cm3. The acceptor concentration (Na) of the AlGaN buffer layer 18 is preferably 1.5 times the donor concentration (Nd) or more, and is more preferably twice or more.

The first embodiment uses the specific growth condition in which the growth temperature and the V/III ratio are decreased and the growth rate is increased in order to increase the C concentration of the AlGaN buffer layer 18 and increase the acceptor concentration (Na). However, the first embodiment is not limited to the above. By carrying out at least one of decreasing the growth temperature, increasing the growth rate and decreasing the V/III ratio, it is possible to increase the C concentration of the AlGaN buffer layer 18 and to increase the acceptor concentration (Na).

The first embodiment controls the condition for growing the AlGaN buffer layer 18 to increase the C concentration and set the acceptor concentration (Na) equal to or higher than the donor concentration (Nd). Another method may be used to set the acceptor concentration (Na) equal to or higher than the donor concentration (Nd). For example, an acceptor impurity is added to the AlGaN buffer layer 18 in order to set the acceptor concentration (Na) equal to or higher than the donor concentration (Nd). The acceptor impurity may be Mg (magnesium), P (phosphorus), Zn (zinc), As (arsenic), Cd (cadmium), Ce (cerium), Hg (mercury), Fe (iron), Cr (chromium), Co (cobalt), or Cu (copper).

A description is now given of a simulation of the off-state current-voltage characteristic of a semiconductor device in accordance with a second variation of the first embodiment in which Mg is added to the AlGaN buffer layer 18. The AlGaN buffer layer 18 is grown under the same condition as that of the second comparative example. The second variation has the same structure as illustrated in FIG. 7 except that Mg is added to have a Mg concentration of $1.0×10^{17}/cm^3$ so that the acceptor concentration (Na) is $2.0×10^{16}/cm^3$ and the donor concentration (Nd) is $2.0×10^{16}/cm^3$. In the second variation, the drain current is $8.7×10^{-6}$ A/mm for a gate voltage of −3 V. The pinch-off characteristic is also improved by adding the acceptor impurity other than C to the AlGaN buffer layer 18.

In the above-described first embodiment, an increased C concentration of the AlGaN buffer layer 18 realizes the acceptor concentration (Na) that is equal to or higher than the donor concentration (Nd). Another example is to reduce the O concentration and the Si concentration without positively changing the C concentration to realize the acceptor concentration (Na) equal to or higher than the donor concentration (Nd). The method for increasing the C concentration to increase the acceptor concentration (Na) results in a larger number of traps in the AlGaN buffer layer 18. Thus, it is preferable to reduce the donor concentration (Nd) in terms of the influence to the reliability of the semiconductor device.

A description is now given of a simulation of the off-state current-voltage characteristic of a semiconductor device in accordance with a third variation of the first embodiment. The third variation is the same as illustrated in FIG. 7 except that the AlGaN buffer layer 18 is grown under the following condition to reduce the O concentration so that the acceptor concentration (Na) is $2.0×10^{16}/cm^3$ and the donor concentration (Nd) is $1.0×10^{16}/cm^3$.

Source gas: TEA (triethylaluminum), TMG, NH$_3$
Growth temperature: 1100° C.
Pressure: 13.3 kPa
V/III ratio: 5000
Growth rate: 0.2 nm/sec
Al composition ratio: 5%
Thickness: 1000 nm In the third variation, the drain current is 1.3×10−5 A/mm for a gate voltage of −3 V. Thus, the O concentration of the AlGaN buffer layer 18 is reduced so that the pinch-off characteristic can be improved even when the acceptor concentration (Na) is set equal to or higher than the donor concentration (Nd).

In the third variation, the source used to grow the AlGaN buffer layer 18 includes TEA, TMG and NH3. The source is not limited to the above, but TEA may be replaced by TBA (tributylaluminum), DIBAH (diisobutyl aluminum hydride) or Al(MMP)$_3$. The O concentration is also reduced by using any of the other sources.

Second Embodiment

Figure 9:
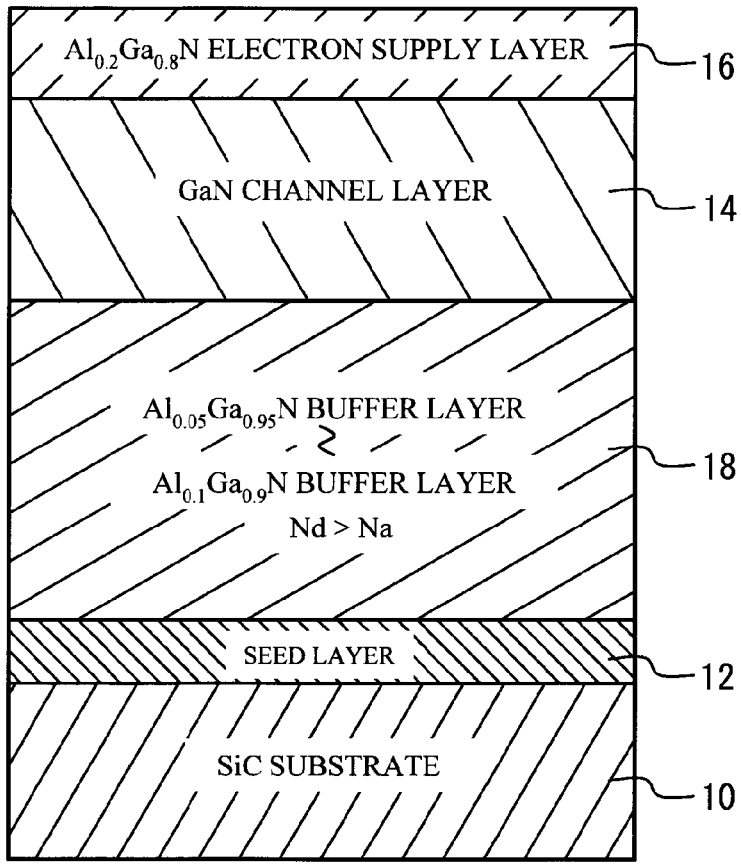
FIG. 9 is a schematic cross-sectional view of an epitaxial layer of a semiconductor device in accordance with a second embodiment.

FIG. 9 is a schematic cross-sectional view of a semiconductor device in accordance with a second embodiment. Referring to FIG. 9, the surfaces of the SiC substrate 10 after acid cleaning is cleaned in an H$_2$ atmosphere at a temperature higher than the growth temperature. Next, the seed layer 12 made of AlN is grown on the SiC substrate 10 by MOCVD under the following condition.

Source gas: TMA, NH$_3$
Growth temperature: 1100° C.
Pressure: 13.3 kPa
Thickness: 25 nm The AlGaN buffer layer 18 is grown on the seed layer 12 under the following condition.

Source gas: TMA, TMG, NH$_3$
Growth temperature: 1100° C.
Pressure: 13.3 kPa
V/III ratio: 5000
Growth rate: 0.2 nm/sec
Al composition ratio: gradually decreasing from 10% to 5% from the seed layer 12 to the GaN channel layer 14 (that is, the Al composition ratio closest to the seed layer 12 is 10% and that closest to the GaN channel layer 14 is 5%)
Thickness: 1000 nm The GaN channel layer 14 is grown on the AlGaN buffer layer 18 under the following condition.

Source gas: TMG, NH$_3$
Growth temperature: 1100° C.
Pressure: 13.3 kPa
V/III ratio: 5000
Growth rate: 0.2 nm/sec
Thickness: 500 nm The AlGaN electron supply layer 16 is grown on the GaN channel layer 14 under the following condition.

Source gas: TMA, TMG, NH$_3$
Al composition ratio: 20%
Thickness: 25 nm

Figure 10:
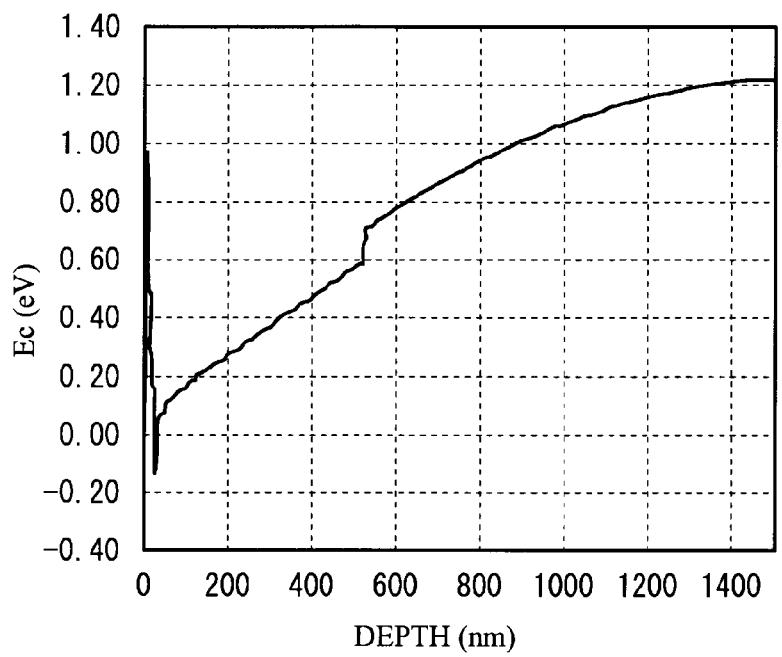
FIG. 10 is a band diagram obtained by simulating a change of Ec associated with the depth from the upper surface of an AlGaN electron supply layer illustrated in FIG. 9.

FIG. 10 is a band diagram obtained by simulating a change of Ec associated with the depth from the upper surface of the AlGaN electron supply layer 16 illustrated in FIG. 9. In the simulation of the second embodiment, the acceptor concentration (Na) of the AlGaN buffer layer 18 is $1.0 \times 10^{16}$/cm$^3$, the donor concentration (Nd) thereof is $2.0 \times 10^{16}$/cm$^3$, and the influence of piezoelectric charge is $4.0 \times 10^{16}$/cm$^3$. As illustrated in FIG. 10, Ec of the AlGaN buffer layer 18 is higher than that of the first embodiment. The reason why the AlGaN buffer layer 18 of the second embodiment has an increased Ec may be considered as follows. Piezoelectric polarization is an electric polarization of the semiconductor layer. Piezoelectric polarization is caused by deformation in the crystal. For example, piezoelectric polarization may occur in a stacked layer of thin films having different lattice constants. As the Al composition of AlGaN becomes smaller, the lattice constant becomes larger. When the Al composition of the AlGaN buffer layer 18 is changed from 10% to 5%, the lattice constant changes. It may be understood that a continuous change of the lattice constant of the AlGaN buffer layer 18 develops negative change in the whole AlGaN buffer layer 18 due to piezoelectric polarization for a growth plane of (0001), and raises Ec of the AlGaN buffer layer 18.

Figure 11:
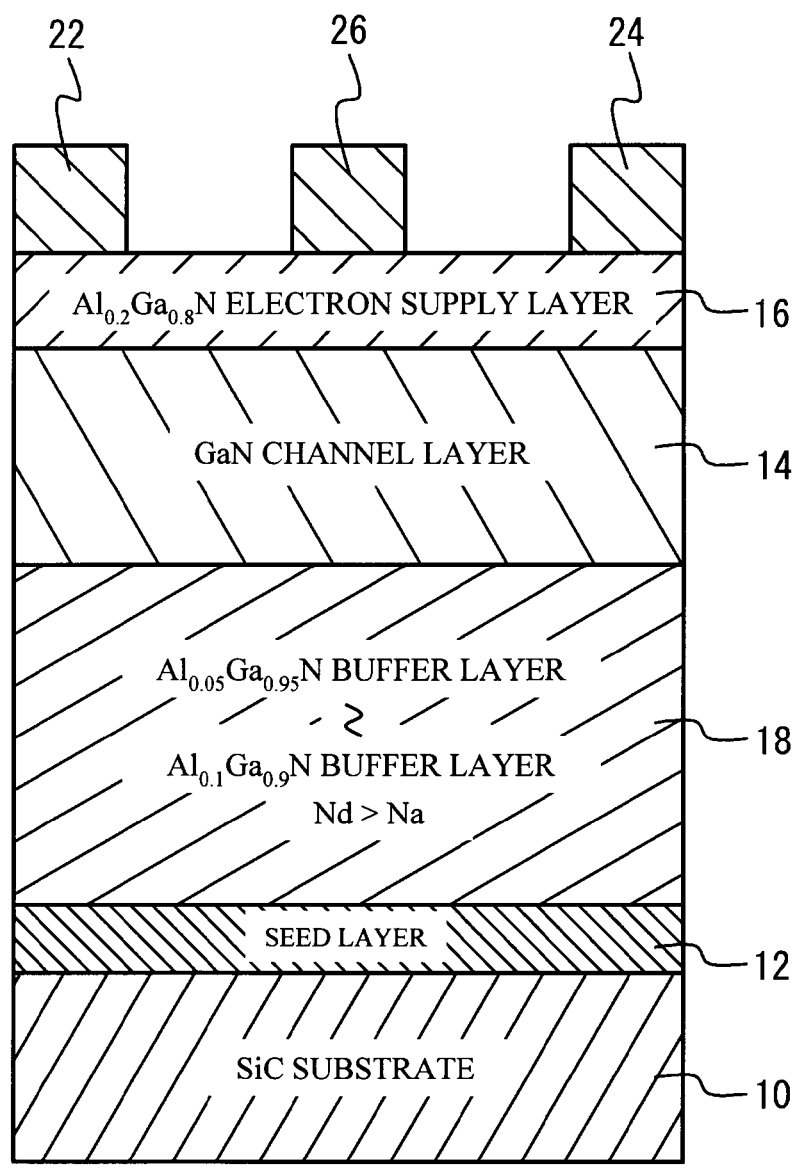
FIG. 11 is a schematic cross-sectional view of another semiconductor device in accordance with the second embodiment.

FIG. 11 is a schematic cross-sectional view of a semiconductor device in accordance with a second embodiment. Referring to FIG. 11, the semiconductor device of the second embodiment includes the epitaxial layer described with reference to FIG. 9, and has the source electrode 22 and the drain electrode 24 on the AlGaN electron supply layer 16 on which the gate electrode 26 is also provided so as to be interposed between the source electrode 22 and the drain electrode 24. The source electrode 22 and the drain electrode 24 are ohmic electrodes. The structures of the source electrode 22, the drain electrode 24 and the gate electrode 26 are the same as those of the first embodiment.

Figure 12:
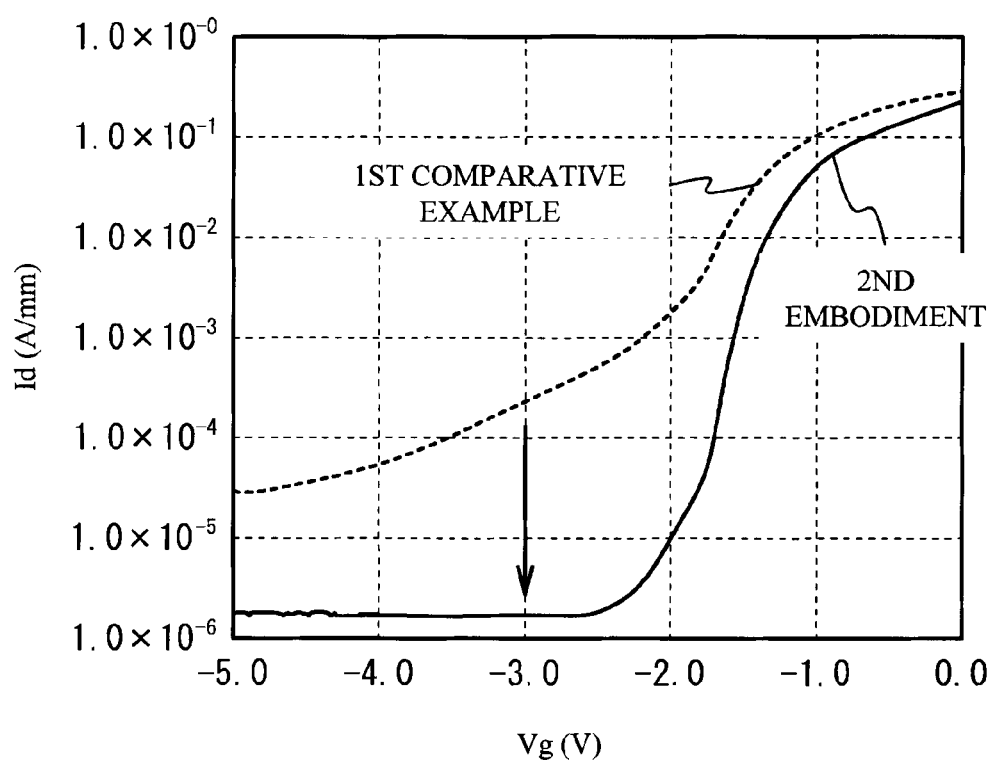
FIG. 12 is a diagram illustrates simulation results of an off-state current-voltage characteristic of the semiconductor device in accordance with the second embodiment.

FIG. 12 illustrates results of a simulation of the off-state current-voltage characteristic of the semiconductor device of the second embodiment. For the purpose of comparison with the second embodiment, FIG. 12 illustrates the results of a simulation of the off-state current-voltage characteristic of the semiconductor device of the first comparative example. The horizontal axis of FIG. 12 denotes the gate voltage Vg, and the vertical axis denotes the drain current Id. As illustrated in FIG. 12, the drain current Id of the first comparative example is $3.3 \times 10^{-4}$ A/mm for a gate voltage Vg of −3 V. The drain current Id of the second embodiment is $1.7 \times 10^{-6}$ A/mm for a gate voltage of −3 V. The second embodiment is capable of achieving improvement in the pinch-off characteristic.

As described above, the second embodiment has the AlGaN buffer layer 18 configured so that the Al composition ratio decreases from the SiC substrate 10 towards the GaN channel layer 14 and that the Al composition ratio of the AlGaN buffer layer 18 is 10% on the side close to the SiC substrate 10 and is 5% on the other side close to the GaN channel layer 14. It is thus possible to raise Ec and improve the pinch-off characteristic.

The Al composition ratio of the AlGaN buffer layer 18 is not limited to the above. In order to generate the negative piezoelectric charge in the whole AlGaN buffer layer 18 and raise Ec, it is preferable that the difference in the Al composition ratio between the side close to the SiC substrate 10 and the other side close to the GaN channel layer 14 is within 20%. The difference is more preferably within 10% and is much more preferably not greater than 5%.

The second embodiment is not limited to the continuous change of the Al composition ratio of the AlGaN buffer layer 18 but may have a stepwise change.

The electron supply layers employed in the first and second embodiments are not limited to AlGaN but may have another material having a band gap greater than that of GaN.

The present invention is not limited to the specifically disclosed embodiments but various embodiments and variations may be made without the departing from the claimed invention.

What is claimed is:

1. A semiconductor device comprising:
    an AlGaN layer that is provided on a SiC substrate and has an acceptor concentration equal to or higher than a total donor concentration in the AlGaN layer;
    a GaN layer provided on the AlGaN layer; and
    an electron supply layer that is provided on the GaN layer and has a band gap greater than that of GaN,
    wherein the AlGaN layer includes carbon as an acceptor impurity and oxygen and silicon as a donor impurity, and a concentration of the carbon is equal to or higher than a sum of a concentration of the oxygen and that of the silicon.

2. The semiconductor device according to claim 1, wherein the acceptor concentration is equal to or larger than twice the donor concentration.

3. The semiconductor device according to claim 1, wherein the AlGaN layer includes, as the acceptor impurity, at least one of Mg, P, Zn, As, Cd, Hg, Fe, Cr, Co and Cu.

4. The semiconductor device according to claim 1, further comprising an AlN layer provided between the SiC substrate and the AlGaN layer.

5. The semiconductor device according to claim 4, wherein the AlN layer contacts an upper face of the SiC substrate, the AlGaN layer contacts an upper face of the AlN layer, and the GaN layer contacts an upper face of the AlGaN layer.

* * * * *